United States Patent [19]

Das

[11] Patent Number: 5,285,089
[45] Date of Patent: Feb. 8, 1994

[54] DIAMOND AND SILICON CARBIDE HETEROJUNCTION BIPOLAR TRANSISTOR

[75] Inventor: Kalyankumar Das, Raleigh, N.C.

[73] Assignee: Kobe Steel U.S.A., Inc., Research Triangle Park, N.C.

[21] Appl. No.: 985,180

[22] Filed: Dec. 2, 1992

[51] Int. Cl.⁵ ............... H01L 31/072; H01L 31/109; H01L 29/04; H01L 29/12
[52] U.S. Cl. .................... 257/197; 257/198; 257/77; 257/51; 257/613
[58] Field of Search ............ 257/197, 76, 77, 78, 257/51, 613

[56] References Cited

U.S. PATENT DOCUMENTS

| | | | |
|---|---|---|---|
| 4,985,742 | 1/1991 | Pankove | 257/77 |
| 5,034,784 | 7/1991 | Yamazaki | 257/77 |
| 5,089,428 | 2/1992 | Verret et al. | 437/31 |
| 5,117,267 | 5/1992 | Kimoto et al. | 257/77 |
| 5,132,749 | 7/1992 | Nishibayashi et al. | 257/77 |
| 5,173,761 | 12/1992 | Dreifus et al. | 257/51 |

FOREIGN PATENT DOCUMENTS

0399241A1  11/1990  European Pat. Off. .

OTHER PUBLICATIONS

Prins, "Bipolar Transistor Action in Ion Implanted Diamond", Appl. Phys. Lett. 41(10), Nov. 15, 1982, pp. 950–952.

Stoner et al, "Textured Diamond Growth on (100) β-SiC via Microwave Plasma Chemical Vapor Deposition", Appl. Phys. Lett. 60(6), Feb. 10, 1992, pp. 698–700.

Kawarada et al., "Large Area Chemical Vapor Deposition of Diamond Particles and Films Using Magneto-Microwave Plasma", vol. 26, No. 6, Jun. 1987, pp. L1032–L1034.

Primary Examiner—William Mintel
Assistant Examiner—Wael Fahmy
Attorney, Agent, or Firm—Bell, Seltzer, Park & Gibson

[57] ABSTRACT

A double heterojunction bipolar transistor includes diamond as the semiconductor material for the collector and emitter, while silicon carbide provides the base. Accordingly, the diamond is readily and reproducibly p-doped, and the silicon carbide may be fabricated by a solid state reaction to form an n-type intrinsic semiconductor. The base is preferably not so thick as to greatly increase transit time, yet sufficiently thick to prevent tunneling. In one embodiment single crystal diamond and single crystal silicon carbide are used in direct contact with each other. In another embodiment of the transistor, polycrystalline diamond is used, and a layer of insulating diamond is positioned between each face of the silicon carbide layer and the diamond layers. A method for fabricating the transistor includes depositing silicon on the diamond and annealing same so as to produce silicon carbide by a solid state reaction. The silicon carbide so produced is intrinsically n-type. Alternately, the silicon carbide may be directly deposited.

20 Claims, 2 Drawing Sheets

DIAMOND AND SILICON CARBIDE HETEROJUNCTION BIPOLAR TRANSISTOR

FIELD OF THE INVENTION

This invention relates to the field of semiconductor devices and, more particularly, to a semiconductor double heterojunction bipolar transistor capable of high temperature operation.

BACKGROUND OF THE INVENTION

Bipolar transistors fabricated using conventional semiconductor materials, such as silicon, are widely used. Bipolar transistors offer short electron transit times, thereby offering high cutoff frequencies without particularly stringent demands on lithography as is typically required with Field Effect Transistors (FET's). In addition, the entire emitter area of a bipolar transistor conducts current, unlike a FET in which only a thin surface channel conducts current. Accordingly, a bipolar transistor may provide high current output per unit of chip area, while permitting and maintaining high circuit density.

Continuous progress has been made in building upon the advantages of bipolar transistors while minimizing their shortcomings. The use of heterojunctions, that is, junctions formed of two different semiconductor materials, has added a new degree of freedom in transistor design and enabled higher operating speeds. Considerable improvement in transistor performance may be obtained by intentionally changing the semiconductor material composition of a heterojunction bipolar transistor (HBT) to produce a bandgap that is wider in the emitter, for example. Moreover, appropriate combinations of electric fields and bandgap variations permit the forces on holes and electrons to be established separately. See, for example, Chapter 6 "Bipolar Transistors", by Asbeck in *High-Speed Semiconductor Devices*, edited by Sze, pp. 358-391 (1990).

As discussed in *High-Speed Semiconductor Devices*, HBT's have been explored using conventional semiconductor materials having matching lattice constants, such as including GaAlAs/GaAs and InGaAs/InAlAs/InP. U.S. Pat. No. 5,089,428 to Verret et al. entitled *Method for Forming a Germanium Layer and a Heterojunction Bipolar Transistor* discloses an HBT having an N-$Ge_xSi_{1-x}$ layer deposited onto an N-Si substrate. The substrate having these layers formed thereon is heated in an oxidizing ambient which causes the p-$Ge_xSi_{1-x}$ layer to transform into a pure Ge layer.

U.S. Pat. No. 5,117,267 to Kimotor et al. entitled *Semiconductor Heterojunction Structure* suggests that an HBT may be formed using n-type cubic boron nitride (c-BN) with p-type diamond. Diamond is a preferred material for semiconductor devices because it has semiconductor properties that are better than silicon, germanium or gallium arsenide. Diamond provides a higher energy bandgap, a higher breakdown voltage and a higher saturation velocity than these traditional semiconductor materials.

These properties of diamond yield a substantial increase in projected cutoff frequency and maximum operating voltage compared to devices fabricated using silicon, germanium or gallium arsenide. Silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond also has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, that is, diamond is a "radiation-hard" material. Because of the advantages of diamond as a material for semiconductor devices, there is at present an interest in the growth and use of diamond for high temperature and radiation-hardened electronic devices, especially transistors.

A diamond bipolar transistor is disclosed in *Bipolar Transistor Action in Ion Implanted Diamond*, by Prins, Applied Physic Letters, 41(10), pp. 950-952, Nov. 15, 1992. Prins discloses a p-type base region formed in a single crystal of natural Boron-doped IIb diamond by ion implanting n-type emitter and collector regions, while the p-type base region is masked by a thin tungsten wire. The ion implantation is intended to produce "radiation damaged" n-type collector and emitter regions from the natural diamond.

A diamond bipolar transistor would offer high temperature performance, as well as other advantages of diamond as a semiconductor material. Unfortunately, reproducible n-type behavior in diamond is difficult to achieve in practice.

An article entitled *Material-Based Comparison for Power Heterojunction Bipolar Transistors*, IEEE Transactions on Electron Devices, Vol. 18, No. 11, November 1991, by Gao and Morkoc discusses a figure of merit based upon material parameters for various HBT's. The article discloses a number of combinations of semiconductor materials for the proposed devices. The article suggests that a wide bandgap material, such as AlGaAs, InP, SiC, GaN or diamond can be used for the base of an HBT. However, as noted in the article, while wide bandgap materials appear to offer an improvement in the figure of merit for an HBT, realization of such devices awaits technological breakthroughs.

SUMMARY OF THE INVENTION

In view of the foregoing background, it is therefore an object of the invention to provide a bipolar transistor and an associated fabrication method offering high temperature performance.

It is another object of the invention to provide a bipolar transistor and an associated fabrication method including diamond as a semiconductor material because of the many advantages of diamond as a semiconductor material including its high temperature performance, radiation-hardened qualities, and high thermal conductivity.

These and other objects, advantages, and features of the present invention are provided by a double heterojunction bipolar transistor including a collector and emitter, each provided by respective diamond layers, and a base therebetween provided by a layer of silicon carbide (SiC). The two diamond layers are preferably p-type diamond, while the SiC layer is preferably n- type. Very similar to diamond, SiC is a semiconductor material well suited for high temperature operation. Thus, the transistor according to the present invention advantageously combines p-type diamond, and n-type SiC, each readily and reproducibly fabricated, as would be understood by those skilled in the art.

The SiC layer preferably has a predetermined thickness to permit sufficient hole mobility for transistor operation without allowing tunneling through the SiC layer. The thickness of the SiC layer is preferably not greater than about 500Å to provide a sufficiently short transit time, and not less than about 50Å to prevent tunneling through the SiC layer. In addition, the dopant concentration of the SiC layer is preferably in the range of about $10^{15}$ to $10^{16}$ cm$^{-3}$. The predetermined dopant concentration is readily achieved by the intrinsic dopant concentration of a SiC layer produced by first depositing a silicon layer on diamond, and then annealing the thus-deposited silicon layer at a temperature in the range of about 900° C. to 1300° for about 15 minutes to 6 hours to form the layer of SiC.

In one embodiment of the transistor, both diamond layers are single crystal diamond. Therefore, the SiC layer is also preferably single crystal and preferably in atomic registry with the respective diamond layers. As would be readily understood by those skilled in the art, SiC is a material with a relatively close lattice match with diamond, hence, making the single crystal structure achievable. In another embodiment of the transistor, the diamond layers are polycrystalline and an intervening insulating layer is positioned between each face of the SiC layer and the respective diamond layers of the collector and emitter. The insulating layers are preferably insulating diamond to thus permit high temperature operation of the transistor.

As discussed briefly above, a method for making the bipolar transistor according to the present invention includes the steps of forming a first diamond layer, forming a SiC layer on the first diamond layer and forming a second diamond layer on the SiC layer to provide a collector, base, and emitter, respectively. The layer of SiC may be formed by depositing a layer of silicon and annealing the layer at a temperature in the range of about 900° to 1300° C. for a time period of 5 minutes to 6 hours. If the first and second diamond layers are polycrystalline, an insulating layer of insulating diamond, for example, is preferably formed on each face of the SiC layer.

Alternately, the layer of SiC may be directly deposited onto the diamond by conventional deposition techniques, such as chemical vapor deposition, sputtering or molecular beam epitaxy (MBE). The thus-deposited layer of SiC is also preferably annealed.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. The thickness of layers and regions are exaggerated for clarity.

Figure 1:
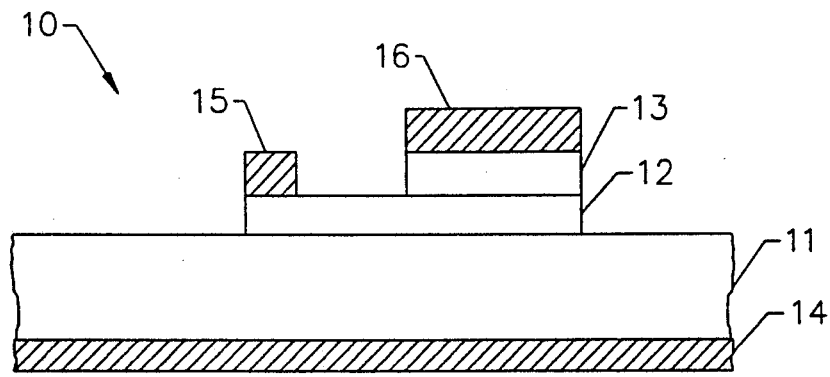
FIG. 1 is a cross-sectional side view of an embodiment of a heterojunction bipolar transistor according to the invention.

A first embodiment of a double heterojunction bipolar transistor 10 according to the invention is shown in FIG. 1. The transistor 10 includes a collector formed by a first semiconducting diamond layer 11. A base provided by a layer of semiconducting SiC 12 is formed on the diamond layer 11. An emitter provided by a second layer of semiconducting diamond 13 is formed on the SiC layer 12. A collector contact 14, a base contact 15, and an emitter contact 16 are formed on the respective collector, base, and emitter regions of the transistor 10 as would be readily understood by those skilled in the art. The contacts 14, 15 and 16 may be refractory metals or other high temperature conductive materials, such as a titanium and gold bilayer, that form good ohmic contacts to diamond. The respective semiconductor surface regions underlying the contacts 14, 15 and 16 may also be highly doped to not less than about $10^{20}$ cm$^{-3}$ to form low resistance ohmic contacts.

Both of the diamond layers 11, 13 are of a first conductivity type, while the SiC layer 12 is of a second conductivity type. Because diamond is readily and reproducibly doped with Boron to form a p-type semiconductor material, both the first and second diamond layers 11, 13 are preferably p-type. In addition, the SiC layer 12 is readily and reproducibly formed to be intrinsically n-doped as discussed further below with respect to a method for making the transistor 10 according to the invention. Moreover, SiC is a material like diamond that is robust in a high temperature environment. Thus, the transistor 10 according to the present invention advantageously combines p-type diamond and n-type SiC to permit high temperature operation, and, moreover, to permit the transistor to be readily and reproducibly fabricated.

The diamond layers 11, 13 of the embodiment of the transistor 10 illustrated in FIG. 1 are both preferably formed of single crystal diamond. Thus, the SiC layer 12 is also preferably single crystal and, more particularly, is preferably in atomic registry with the adjacent respective single crystal diamond layers 11,13 of the collector and emitter.

As would be readily understood by those skilled in the art, the single crystal diamond layer 11 of the collector may be provided by a bulk single crystal of diamond, or by a layer of single crystal diamond formed on a suitable substrate, such as by chemical vapor deposition of the diamond layer on a suitable substrate. Suitable substrates for forming a single crystal diamond layer have a relatively close lattice match with diamond and may include SiC, crystalline nickel, crystalline copper, or alloys of nickel and copper.

The thickness of the SiC layer 12 of the base is selected to provide a sufficiently short transit time for bipolar transistor operation. In other words, the thickness of the SiC layer should not be so thick as to increase the transit time to the point where the double heterojunction structure functions as back-to-back p-n junctions rather than as a bipolar transistor. Accordingly, the thickness of the SiC layer 12 is preferably not greater than about 500Å. This thickness is also related to the n-type dopant concentration level of the SiC layer 12 formed according to the method discussed in greater detail below.

The SiC layer 12 should also be sufficiently thick to prevent a substantial degree of tunneling through the SiC layer 12. Accordingly, the SiC layer should not be less than about 50Å thick.

Figure 2:
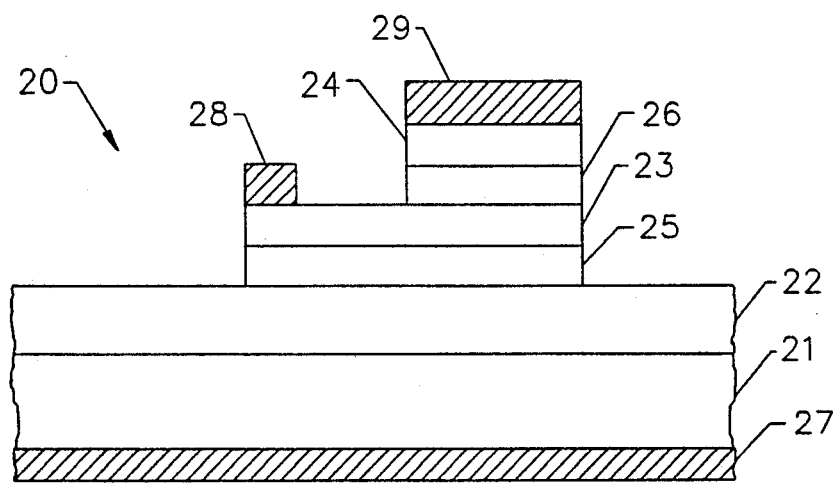
FIG. 2 is a cross-sectional side view of another embodiment of a heterojunction bipolar transistor according to the invention.

Referring now to FIG. 2, another embodiment of the transistor according to the invention is shown generally designated by numeral 20. The transistor 20 has a collector which includes a substrate 21 upon which is formed a layer of polycrystalline diamond 22. As would be readily understood by those skilled in the art, a polycrystalline diamond layer is readily formed by chemical vapor deposition onto a nondiamond substrate such as silicon, and, therefore, is less expensive than single crystal diamond which typically requires a single crystal diamond substrate.

A base is provided on the collector and includes a SiC layer 23 with an insulating layer 25, 26 at each opposing face thereof. An emitter is provided by a polycrystalline diamond layer 26 on the insulating layer 26 of the base. Since the transistor 20 is advantageously operated at high temperatures, the preferred material for the insulating layers 25, 26 is insulating diamond. Preferably the thickness of the insulating diamond layers 25, 26 is greater than a tunneling thickness so that the base acts as a rectifying contact. Accordingly, the thickness of the insulating diamond layers is greater than about 20Å.

Figure 3:
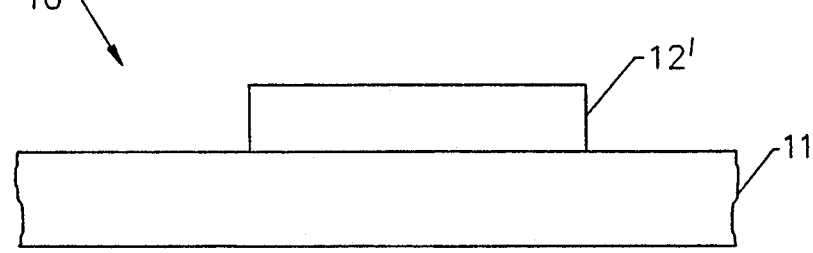
FIGS. 3 and 4 are cross-sectional side views illustrating intermediate processing steps for fabricating the heterojunction bipolar transistor as shown in FIG. 1.
Figure 4:
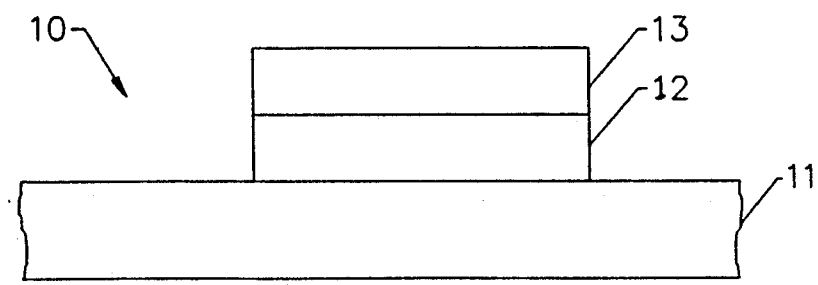

Referring now additionally to FIGS. 3 and 4, a method for making a high temperature heterojunction bipolar transistor 10 as shown in FIG. 1 is described. A layer of single crystal diamond 11 is formed. As would be readily understood by those skilled in the art, the step Of forming the first diamond layer 11 may be practiced by providing a single crystal diamond substrate of naturally occurring diamond, or depositing a layer of single crystal diamond onto a nondiamond substrate having a relatively close lattice match with diamond, or depositing a layer of single crystal diamond onto a diamond substrate. The single crystal diamond is preferably p-type, as is readily obtainable using Boron doping and is preferably doped with Boron to a dopant concentration in the range of $10^{16}$ to $10^{19}$ cm$^{-3}$.

One aspect of the method according to the invention is that the SiC layer 12 may be formed by depositing a layer of silicon 12' on the first diamond layer 11 as shown in FIG. 3, and then annealing the silicon to form SiC by solid state reaction with the diamond. In particular, the annealing is preferably carried out at a temperature in the range of about 900° to 1300° C. for a time of 15 minutes to 6 hours. More preferably, the annealing is carried out for about 1 hour at a temperature of about 1000° C., or about 30 minutes at a temperature of about 1200° C.

As would be readily understood by those skilled in the art, the SiC layer 12 so formed is intrinsically n-doped to a desired level of about $10^{15}$ cm$^{-3}$ to $10^{16}$ cm$^{-3}$, although higher dopant concentrations may readily be achieved by conventional doping techniques. In other words, additional dopant may be added by conventional techniques, such as ion implantation, to produce a highly controllable and reproducible dopant concentration. See, for example, *"Thin Film Deposition and Microelectronic and Optoelectronic Device Fabrication and Characterization in Monocrystalline Alpha and Beta Silicon Carbide"*, by Davis et al., Proceedings of the IEEE, Vol. 79, No. 5, pp. 677–701, May 1991, the disclosure of which is hereby incorporated herein by reference.

As would be readily understood by those skilled in the art, a layer of SiC 12 may also be directly deposited Onto the first diamond layer 11, such as by conventional deposition techniques. A directly deposited SiC layer is also preferably annealed.

As shown in FIG. 4, a second single crystal diamond layer 13 is then formed on the SiC layer 12. The second single crystal diamond layer 13 is preferably formed by plasma enhanced chemical vapor deposition onto the SiC layer 12 which has a relatively close lattice match with diamond. Ohmic contact layers 14, 15 and 16 may then be formed onto the respective collector, base and emitter regions of the transistor 10 producing the transistor as shown in FIG. 1.

Figure 5:
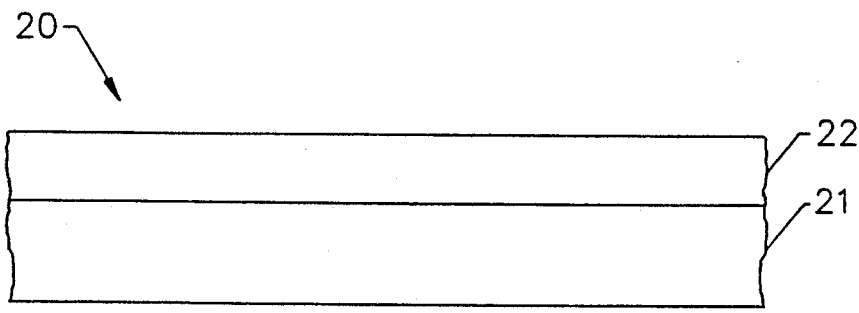
FIGS. 5, 6 and 7 are cross-sectional side views illustrating intermediate processing steps for fabricating the heterojunction bipolar transistor as shown in FIG. 2.
Figure 6:
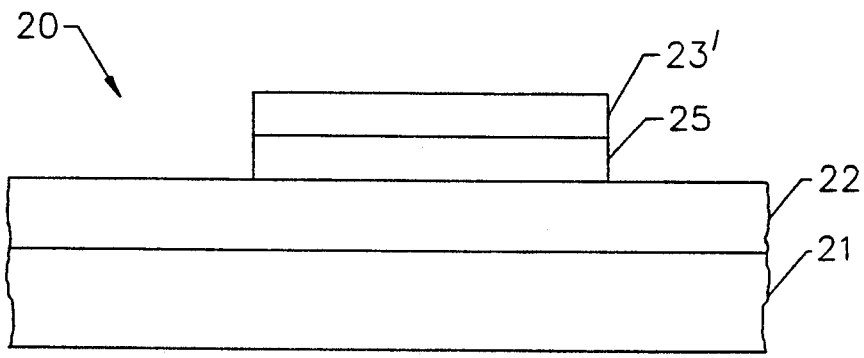
Figure 7:
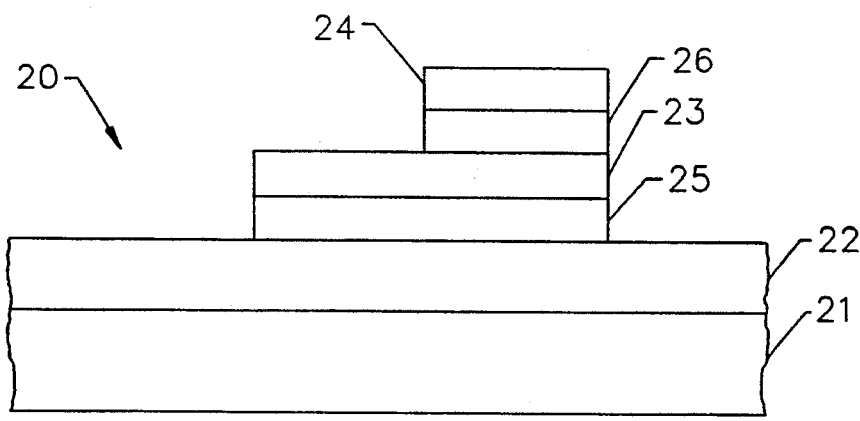

Referring now to FIGS. 2, 5, 6 and 7, a method for fabricating the transistor 20 as shown in FIG. 2 and including polycrystalline diamond is explained. The method includes the steps of forming a first polycrystalline diamond layer 22 on a non-diamond substrate 21 (FIG. 5). An insulating layer 25, such as insulating diamond, is formed on the first polycrystalline diamond layer 22 and a layer of silicon 23' may then be formed on the insulating layer 25 (FIG. 6) and annealed as described above thereby forming a SiC layer 23. Another insulating layer 26 and a second polycrystalline diamond layer 27 may then be formed to produce the structure as shown in FIG. 7. Ohmic contact layers 27, 28 and 29 may then be formed onto the respective collector, base and emitter regions of the transistor 20 producing the transistor as shown in FIG. 2.

As would be readily understood by those skilled in the art, the layer of SiC 23 may also be directly deposited onto the insulating layer 25, such as by conventional deposition.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. A heterojunction bipolar transistor comprising:
   a collector comprising a layer of p-type semiconducting diamond;
   a base on said collector, said base comprising a layer of n-type semiconducting silicon carbide; and
   an emitter on said base, said emitter comprising a layer of p-type semiconducting diamond.

2. A heterojunction bipolar transistor according to claim 1 wherein said silicon carbide layer has a thickness not greater than a predetermined value to provide a sufficiently short transit time for bipolar transistor operation.

3. A heterojunction bipolar transistor according to claim 2 wherein said silicon carbide layer has a thickness not greater than about 500Å.

4. A heterojunction bipolar transistor according to claim 1 wherein said thickness of said base is not less than a tunneling thickness.

5. A heterojunction bipolar transistor according to claim 4 wherein said silicon carbide layer has a thickness not less than about 50Å.

6. A heterojunction bipolar transistor comprising:
a collector comprising a layer of single crystal p-type semiconducting diamond;
a base comprising a layer of n-type semiconducting silicon carbide on said single crystal diamond layer of said collector; and
an emitter comprising a layer of p-type single crystal semiconducting diamond on said base.

7. A heterojunction bipolar transistor according to claim 6 wherein said silicon carbide layer has a thickness not greater than a predetermined value to provide a sufficiently short transit time for bipolar transistor operation.

8. A heterojunction bipolar transistor according to claim 7 wherein said silicon carbide layer has a thickness not greater than about 500Å.

9. A heterojunction bipolar transistor according to claim 1 wherein said thickness of said base is not less than a tunneling thickness.

10. A heterojunction bipolar transistor according to claim 9 wherein said silicon carbide layer has a thickness not less than about 50Å.

11. A heterojunction bipolar transistor comprising:
a collector comprising a layer of p-type polycrystalline semiconducting diamond;
a base on said collector, said base comprising a layer of n-type semiconducting silicon carbide; and
an emitter on said base, said emitter comprising a layer of p-type polycrystalline semiconducting diamond.

12. A heterojunction bipolar transistor according to claim 11 wherein said base further comprises an insulating layer on each face of said silicon carbide layer between respective layers of polycrystalline diamond.

13. A heterojunction bipolar transistor according to claim 12 wherein said insulating layer comprises insulating diamond.

14. A heterojunction bipolar transistor according to claim 11 wherein said silicon carbide layer has a thickness not greater than a predetermined value to provide a sufficiently short transit time for bipolar transistor operation.

15. A heterojunction bipolar transistor according to claim 14 wherein said silicon carbide layer has a thickness not greater than about 500Å.

16. A heterojunction bipolar transistor according to claim 11 wherein said thickness of said base is not less than a tunneling thickness.

17. A heterojunction bipolar transistor according to claim 16 wherein said silicon carbide layer has a thickness not less than about 50Å.

18. A heterojunction bipolar transistor comprising:
a collector comprising a layer of semiconducting diamond having a first conductivity type;
a base on said collector, said base comprising a layer of semiconducting silicon carbide having a second conductivity type, said base having a thickness not greater than a predetermined value to provide a sufficiently short transit time for bipolar transistor operation and the thickness not less than a tunneling thickness; and
an emitter on said base, said emitter comprising a layer of semiconducting diamond having the first conductivity type.

19. A heterojunction bipolar transistor according to claim 18 wherein said silicon carbide layer has a thickness not greater than about 500Å.

20. A heterojunction bipolar transistor according to claim 18 wherein said silicon carbide layer has a thickness not less than about 50Å.

* * * * *

UNITED STATES PATENT AND TRADEMARK OFFICE
CERTIFICATE OF CORRECTION

PATENT NO. :     5,285,089
DATED      :     February 8, 1994
INVENTOR(S) :    Kalyankumar Das It is certified that error appears in the above-identified patent and that said Letters Patent is hereby corrected as shown below:

Column 3, line 45, delete "5" and substitute
    --about 15-- therefor.

Column 5, line 57, delete "1300'" and substitute
    --1300°-- therefor.

Column 7, line 25, delete "Claim 1" and substitute
    --Claim 6-- therefor.

Signed and Sealed this

Twenty-first Day of June, 1994

Attest:

BRUCE LEHMAN

*Attesting Officer*            *Commissioner of Patents and Trademarks*